United States Patent
Wang et al.

(10) Patent No.: US 11,027,217 B2
(45) Date of Patent: Jun. 8, 2021

(54) ELECTRICALLY CONTROLLED NUCLEATION AND CRYSTALLIZATION

(71) Applicant: GEORGIA STATE UNIVERSITY RESEARCH FOUNDATION, INC., Atlanta, GA (US)

(72) Inventors: Gangli Wang, Brookhaven, GA (US); Yan Li, Atlanta, GA (US); Maksim M. Kvetny, Decatur, GA (US)

(73) Assignee: GEORGIA STATE UNIVERSITY RESEARCH FOUNDATION, INC., Atlanta, GA (US)

( * ) Notice: Subject to any disclaimer, the term of this patent is extended or adjusted under 35 U.S.C. 154(b) by 173 days.

(21) Appl. No.: 16/313,666

(22) PCT Filed: Jun. 27, 2017

(86) PCT No.: PCT/US2017/039405
§ 371 (c)(1),
(2) Date: Dec. 27, 2018

(87) PCT Pub. No.: WO2018/005426
PCT Pub. Date: Jan. 4, 2018

(65) Prior Publication Data
US 2020/0306664 A1  Oct. 1, 2020

Related U.S. Application Data
(60) Provisional application No. 62/354,871, filed on Jun. 27, 2016.

(51) Int. Cl.
*C30B 7/12* (2006.01)
*B01D 9/00* (2006.01)
*C30B 30/02* (2006.01)

(52) U.S. Cl.
CPC .............. *B01D 9/0063* (2013.01); *C30B 7/12* (2013.01); *C30B 30/02* (2013.01)

(58) Field of Classification Search
CPC .... C30B 7/00; C30B 7/12; C30B 7/14; C30B 29/54
See application file for complete search history.

(56) References Cited

U.S. PATENT DOCUMENTS

| | | | |
|---|---|---|---|
| 8,945,303 B2 * | 2/2015 | Wakamatsu | C30B 30/02 117/68 |
| 2008/0044914 A1 | 2/2008 | Pamula et al. | |
| 2009/0101491 A1 | 4/2009 | Bukshpan | |
| 2010/0105866 A1 | 4/2010 | Fraden et al. | |
| 2011/0042215 A1 | 2/2011 | Hou et al. | |

(Continued)

OTHER PUBLICATIONS

Asherie, N. Protein crystallization and phase diagrams. Methods 34, 266-272, doi:http://dx.doi.org/10.1016/j.ymeth.2004.03.028.
(Continued)

*Primary Examiner* — Robert M Kunemund
(74) *Attorney, Agent, or Firm* — Meunier Carlin & Curfman LLC

(57) ABSTRACT

Disclosed herein are systems and methods for the controlled crystallization of a compound. The controlled crystallization is achieved by applying an electric field across solutions of target compound and precipitant, whereby the electric field controls the rate of mixing.

25 Claims, 8 Drawing Sheets

(56) References Cited

U.S. PATENT DOCUMENTS

2012/0018306 A1* 1/2012 Srinivasan ........ B01L 3/502761
204/547
2013/0189581 A1 7/2013 Imaizumi et al.

OTHER PUBLICATIONS

Barends, T. R. M. et al. De novo protein crystal structure determination from X-ray free-electron laser data. Nature 505, 244-247, doi:10.1038/nature12773 http://www.nature.com/nature/journal/v505/n7482/abs/nature12773.html#supplementary-information (2014).
Bernal, J. & Crowfoot, D. X-Ray Photographs of Crystalline Pepsin. Nature 133, doi:10.1038/133794b0 (1934).
Chapman, H. N. Femtosecond X-ray protein nanocrystallography. Nature 470, 73-77 (2011).
Chen, D. L. & Ismagilov, R. F. Microfluidic cartridges preloaded with nanoliter plugs of reagents: an alternative to 96-well plates for screening. Current Opinion in Chemical Biology 10, 226-231, doi:http://dx.doi.org/10.1016/j.cbpa.2006.04.004 (2006).
Gil-Alvaradejo, G. et al. Novel Protein Crystal Growth Electrochemical Cell For Applications In X-ray Diffraction and Atomic Force Microscopy. Crystal Growth & Design 11, 3917-3922, doi:10.1021/cg200485v (2011).
Hansen, C. L., Skordalakes, E., Berger, J. M. & Quake, S. R. A robust and scalable microfluidic metering method that allows protein crystal growth by free interface diffusion. Proceedings of the National Academy of Sciences 99, 16531-16536, doi:10.1073/pnas.262485199 (2002).
Hong, J., Edel, J. B. & deMello, A. J. Micro- and nanofluidic systems for high-throughput biological screening. Drug Discovery Today 14, 134-146, doi:http://dx.doi.org/10.1016/j.drudis.2008.10.001 (2009).
Hou, D. & Chang, H.-C. ac field enhanced protein crystallization. Applied Physics Letters 92, 223902, doi:doi:http://dx.doi.org/10.1063/1.2938887 (2008).
Ielasi, F. S. et al. Dip-Pen Nanolithography-Assisted Protein Crystallization. Journal of the American Chemical Society 137, 154-157, doi:10.1021/ja512141k (2015).
Johansson, L. C. Lipidic phase membrane protein serial femtosecond crystallography. Nature Methods 9, 263-265 (2012).
Kakinouchi, K. et al. Effect of ultrasonic irradiation on protein crystallization. Journal of Crystal Growth 292, 437-440, doi:http://dx.doi.org/10.1016/j.jcrysgro.2006.04.051 (2006).
Kern, J. Room temperature femtosecond X-ray diffraction of photosystem II microcrystals. Proc. Natl Acad. Sci. USA 109, 9721-9726 (2012).
Khurshid, S., Govada, L., El-Sharif, H. F., Reddy, S. M. & Chayen, N. E. Automating the application of smart materials for protein crystallization. Acta Crystallographica Section D: Biological Crystallography 71, 534-540, doi:10.1107/s1399004714027643 (2015).
Khurshid, S., Saridakis, E., Govada, L. & Chayen, N. E. Porous nucleating agents for protein crystallization. Nat. Protocols 9, 1621-1633, doi:10.1038/nprot.2014.109 http://www.nature.com/nprot/journal/v9/n7/abs/nprot.2014.109.html#supplementary-information (2014).
Landau, E. M. & Rosenbusch, J. P. Lipidic cubic phases: A novel concept for the crystallization of membrane proteins. Proceedings of the National Academy of Sciences 93, 14532-14535 (1996).
Liu W, W. D., Wang C, Abola E, Cherezov V. Femtosecond crystallography of membrane proteins in the lipidic cubic phase. e. Phil. Trans. R. Soc. B 369 (2014).
Nanev, C. N. & Penkova, A. Nucleation and growth of lysozyme crystals under external electric field. Colloids and Surfaces A: Physicochemical and Engineering Aspects 209, 139-145, doi:http://dx.doi.org/10.1016/S0927-7757(02)00175-9 (2002).
Nanev, C. N. & Penkova, A. Nucleation of lysozyme crystals under external electric and ultrasonic fields. Journal of Crystal Growth 232, 285-293, doi:http://dx.doi.org/10.1016/S0022-0248(01)01169-1 (2001).
Nieto-Mendoza, E., Frontana-Uribe, B. A., Sazaki, G. & Moreno, A. Investigations on electromigration phenomena for protein crystallization using crystal growth cells with multiple electrodes: effect of the potential control. Journal of Crystal Growth 275, e1437-e1446, doi:http://dx.doi.org/10.1016/j.jcrysgro.2004.11.233 (2005).
Rubin, et al., Crystallization of proteins under an external electric field: A Case Study of Glucose Isomerase. Crystals 2017, 7, 206, 12 pages.
Sazaki, G. Crystal quality enhancement by magnetic fields. Progress in Biophysics and Molecular Biology 101, 45-55, doi:http://dx.doi.org/10.1016/j.pbiomolbio.2009.12.003 (2009).
Sazaki, G., Moreno, A. & Nakajima, K. Novel coupling effects of the magnetic and electric fields on protein crystallization. Journal of Crystal Growth 262, 499-502, doi:http://dx.doi.org/10.1016/j.jcrysgro.2003.09.050 (2004).
Wakamatsu, T. Method and apparatus for characterization of electric field-induced aggregation in pre-crystalline protein solutions. Review of Scientific Instruments 86, 015112, doi:doi:http://dx.doi.org/10.1063/1.4906328 (2015).
Yin, D.-C. Protein crystallization in a magnetic field. Progress in Crystal Growth and Characterization of Materials 61, 1-26, doi:http://dx.doi.org/10.1016/j.pcrysgrow.2015.03.001 (2015).
Zheng, B., Gerdts, C. J. & Ismagilov, R. F. Using nanoliter plugs in microfluidics to facilitate and understand protein crystallization. Current Opinion in Structural Biology 15, 548-555, doi:http://dx.doi.org/10.1016/j.sbi.2005.08.009 (2005).
Zhu, Y. et al. Nanoliter-Scale Protein Crystallization and Screening with a Microfluidic Droplet Robot. Sci. Rep. 4, doi:10.1038/srep05046 http://www.nature.com/srep/2014/140523/srep05046/abs/srep05046.html#supplementary-information (2014).
International Preliminary Report on Patentability issued for Application No. PCT/US2017/039405, dated Jan. 10, 2019.
International Search Report and Written Opinion issued in related International Application No. PCT/US2017/039405 dated Sep. 13, 2017.

* cited by examiner

ELECTRICALLY CONTROLLED NUCLEATION AND CRYSTALLIZATION

CROSS REFERENCE TO RELATED APPLICATION

This application claims the benefit of U.S. Provisional Application 62/354,871, filed on Jun. 27, 2016, the contents of which are hereby incorporated by reference in its entirety.

FIELD OF THE INVENTION

Disclosed here are devices and methods for the controlled crystallization of compounds, including therapeutic small molecules, proteins, protein complexes, and the like.

BACKGROUND

Crystallization is one of the most common ways chemical compounds are purified. Crystallization takes place through sequential stages that are generally divided by two steps—initial nucleation (formation of a nucleus till a critical size is reached/surpassed) and further growth. There is an energy barrier that must be overcome in order for a dissolved compound to nucleate. Once the critical size is reached, normally at tens of nanometers, further crystal growth can be an energetically favored process under appropriate conditions. Selective crystallization can yield specific polymorphs of a drug, often with increased stability or pharmacokinetic properties relative to other crystal forms or the amorphous form. A subset of crystallography, protein crystallography, plays a very important role in structure biology and drug discovery. Crystallization of a protein can elucidate the structure of the protein, and can more clearly define the binding site of a drug or other biomacromolecule. Armed with a detailed understanding of how a drug binds with a protein, researchers can more easily develop therapeutics with increased potency, decreased toxicity or other improved properties. Protein crystallization has a long history, dating at least to 1840 with the observation of hemoglobin crystals in blood preparations. The crystal structure of the protein pepsin further foreshadowed the value of protein crystallography for biological and pharmaceutical discovery. However, protein crystallization has been regarded as a black art rather than science for a long time due to a lack of fundamental understanding and poor predictability of what conditions will yield satisfactory crystals. There are general strategies, but the conditions to obtain macroscopic diffraction-quality protein crystals are highly varied depending particular protein. Lengthy trial and error screening of various conditions can roadblock many research projects.

High-throughput methods have been developed and adopted in most structural biology research to expedite the protein crystal growth. Multiple parameters, albeit still trial-and-error screening, can be tested in parallel, i.e. using multi-well devices. Micro/nanofluidic systems have been explored to further accelerate crystallography research. For example, microfluidic cartridges preloaded with nanoliter plugs of reagents have been designed to screen the parameters or conditions for crystallization using nanoliter plugs of reagents per reaction.

A phase diagram can be used in protein crystallization to determine undersaturated and supersaturated zones (defined by chemical and environmental parameters such as concentration). The supersaturated zone can be further divided into the metastable zone, labile zone and precipitation zone. In the metastable zone, nucleation will not occur spontaneously but further growth of a preformed (or introduced) crystal embryo can be maintained. In the labile zone the seed crystal will form spontaneously and grow. However, the labile zone is usually very narrow and hard to find/maintain (i.e. small variation in concentration). In precipitation zone, the nucleation and growth are both fast, which can lead to the formation of amorphous precipitates or disordered structures.

High throughput methods shorten the time required to obtain a crystal at the expense of using a large excess of samples testing different parameters in parallel, i.e. low efficiency materials-wise. There is a need for improved devices and methods for quickly and reproducibly obtaining high quality crystals of both small molecules and biomacromolecules, including proteins. There is a need for improved devices and methods for rapid screening of different crystallization conditions for individual small molecules or biomacromolecules.

SUMMARY

The disclosed inventions meet one or more of the above-mentioned needs. In particular, disclosed herein are devices and method for the controllable crystallization of a compound, including small molecules and biomacromolecules. The controlled crystallization is achieved by controllably introducing a solution of precipitant into a solution of target compound (or introducing a solution of target compound into a solution of precipitant), thereby controlling the rate of nucleation and crystallization. The controlled introduction of solution is achieved by applying an electric field across the two solutions, optionally in combination with a pressure difference across the solutions, and the two solutions are connected through one or array of nanometer scale pores, through which the electric field controls the rate one solution mixes with the other.

The details of one or more embodiments are set forth in the descriptions below. Other features, objects, and advantages will be apparent from the description and from the claims.

DETAILED DESCRIPTION

Figure 1:
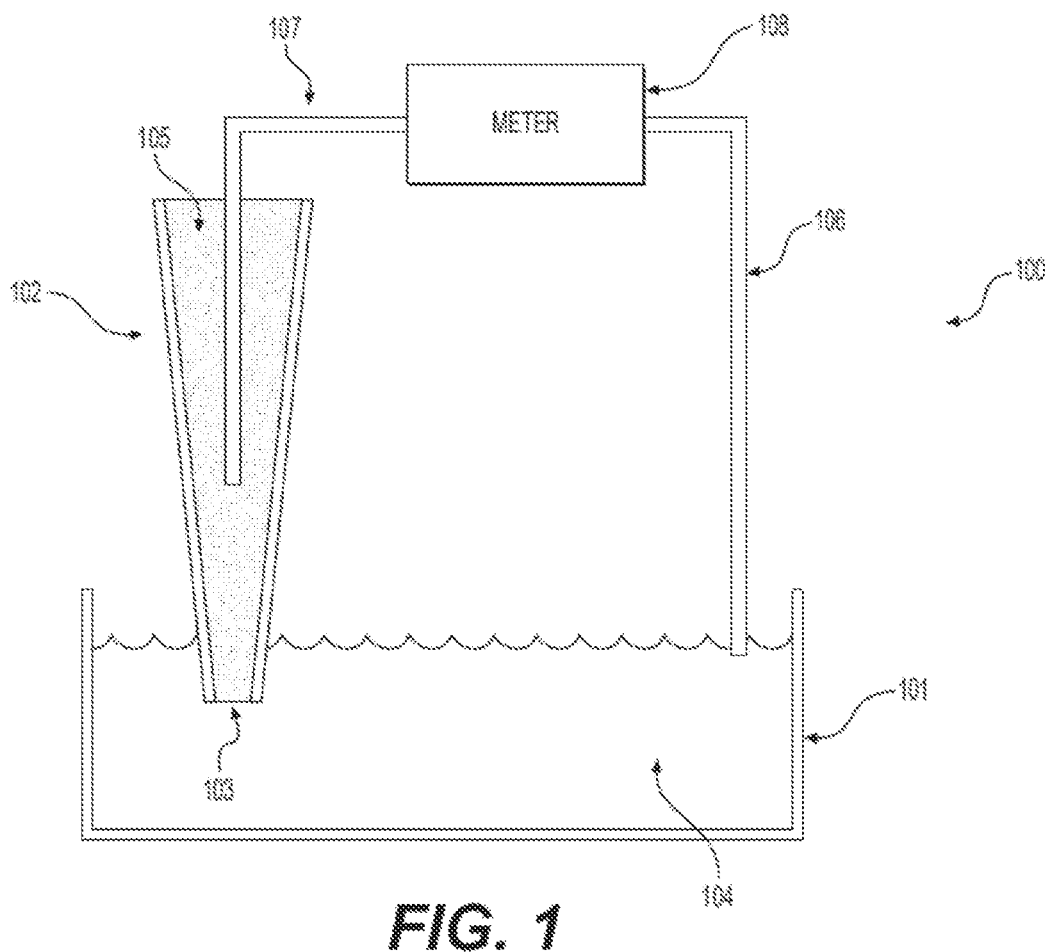
FIG. 1 depicts an embodiments of the invention, in which a single dispensing chamber is disposed in a receiving chamber, in which both the receiving chamber and the dispensing chamber are made of an non-conductor.

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

As used herein, the term "target compound" refers to the substrate which is to be crystallized. The target compound can be a small molecule, a biomacromolecule, or a complex of two of more biomacromolecules and/or small molecules.

As used herein, the term "small molecule" refers to any non-polymeric organic compound having a molecule weight less than about 2,000. The small molecule can include pharmaceutical, veterinary and agrichemicals, as well as intermediates used to prepare such compounds.

As used herein, the term "biomacromolecule" refers to any polymeric compound (or mixture of compounds) of animal or plant origin. Exemplary biomacromolecules include proteins (including peptides and antibodies) polysaccharides and oligosaccharides, and nucleic acids.

As used herein, the term "electrolyte" refers to an electrically conductive liquid.

Systems

Disclosed herein are systems suitable for controllably crystallizing chemical compounds. The systems include at least two chambers, designated herein as a dispensing chamber and a receiving chamber. The system includes at least one aperture providing fluid communication between the dispensing and receiving chambers. The dispensing and receiving chambers are in electrical communication with each other so that an electrical circuit is formed. In other words, mass transport current can flow from one chamber to the other.

Figure 2:
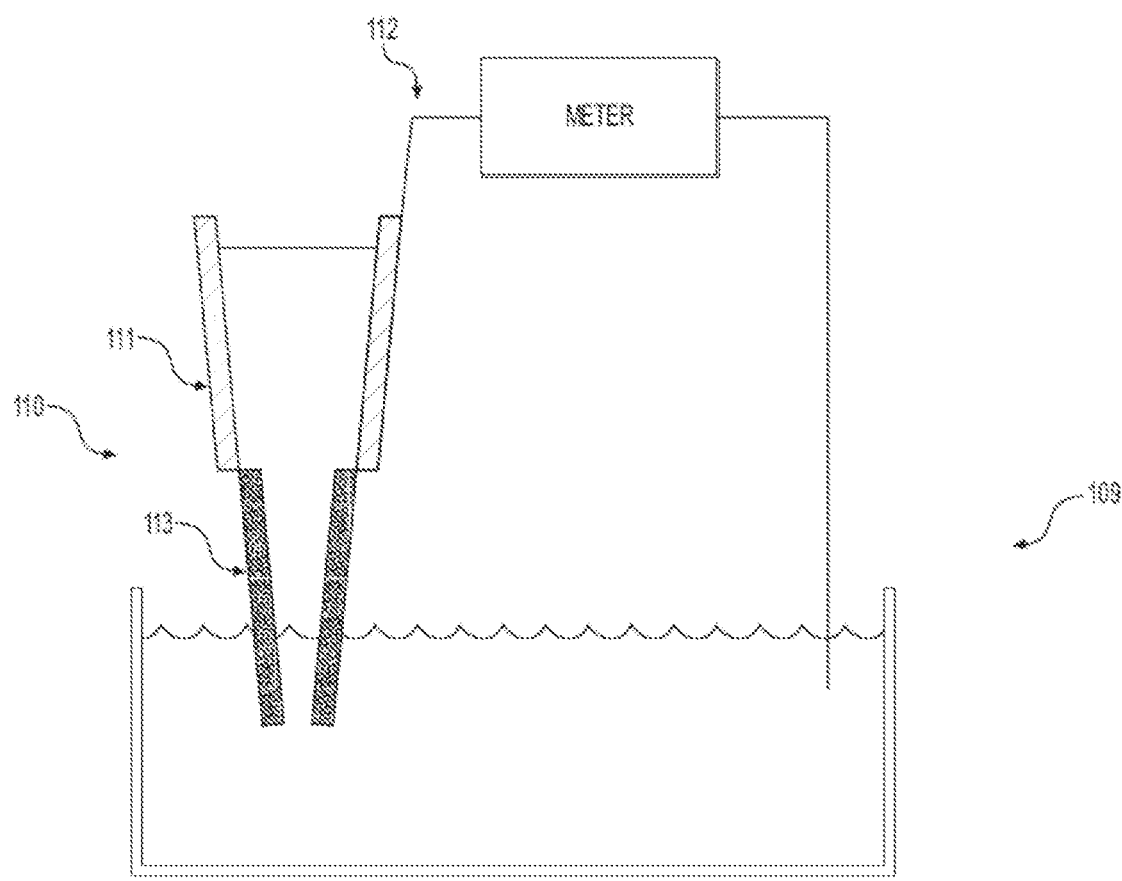
FIG. 2 depicts an embodiments of the invention, in which a single dispensing chamber is disposed in a receiving chamber, in which a portion of the dispensing chamber is made of a conductive material.
Figure 3:
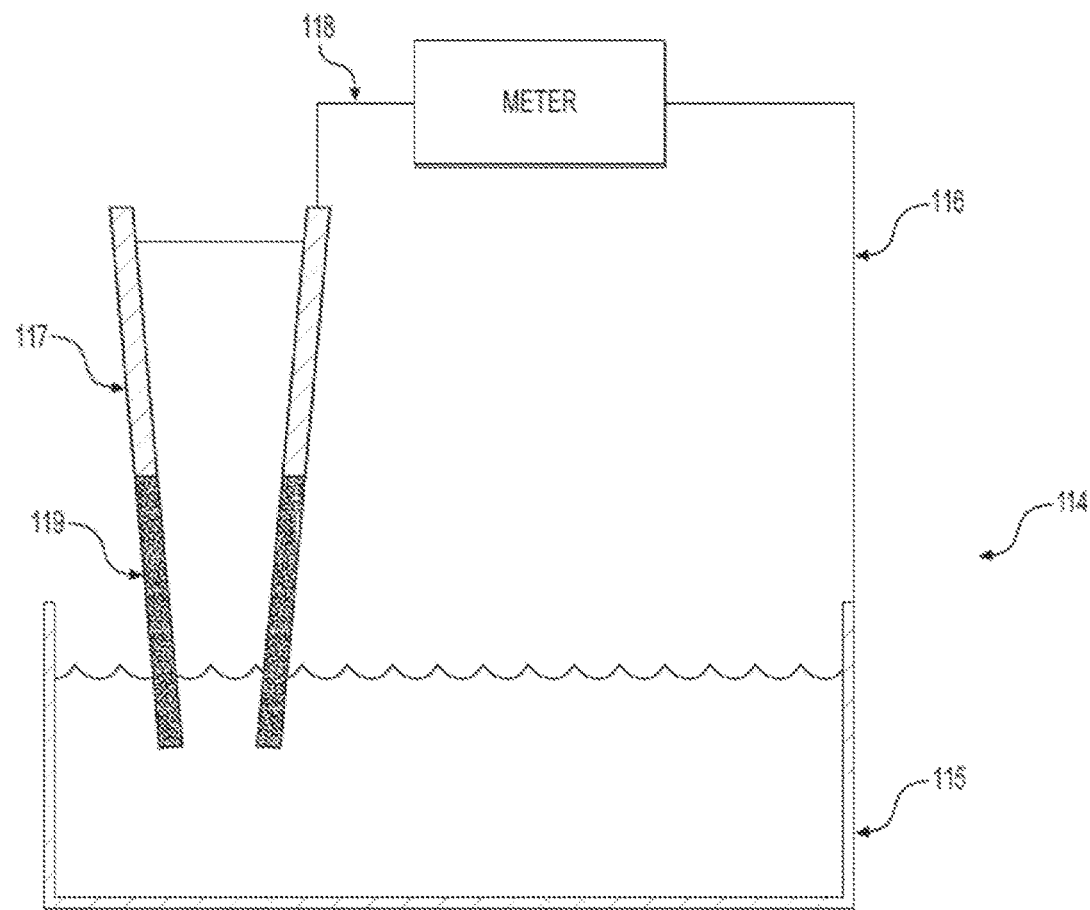
FIG. 3 depicts an embodiments of the invention, in which a single dispensing chamber is disposed in a receiving chamber, in which a portion of the dispensing chamber is made of a conductive material, and at least a portion of the receiving chamber is made from a conductive material.

FIG. 1 illustrates an embodiment of the invention. The system (100) can include a single receiving chamber (101) and single dispensing chamber (102). The dispensing chamber can include one or more apertures (103) through which liquid in the receiving chamber (104) and liquid in the dispensing chamber (105) can mix. The dispensing chamber includes at least a portion that is an electrically insulating material, and this non-conductive material is proximal to the receiving member, meaning that when the receiving chamber contains conductive liquid (105), only the portion of the dispensing chamber than is non-conductive will be in contact with the liquid (104) present in the receiving. The aperture is located in the non-conductive portion. An electrically conductive member (106) is disposed in the receiving chamber and an electrically conductive member (107) is disposed in the receiving chambers, which are in electrical communication with each other through a meter (108). As such, when the liquids (104) and (105) are both conductive such as containing electrolytes and a voltage is applied though the electrical members, a complete circuit is created through aperture (103). In an alternate embodiment, at least a portion of the receiving chamber can include an electrically conductive material, and the electrical member (106) can be directly affixed to said portion. In yet another embodiment at least a portion of the receiving chamber can include an electrically conductive material, and the meter can be directly affixed to said portion. Another embodiment is depicted in FIG. 2, wherein the system (109) can include a dispensing chamber (110) having a portion (111) that is an electrically conductive material, wherein the electrical member (112) is directly affixed to the electrically conductive material. In such embodiments, the portion of the dispensing chamber that contacts electrolyte in the receiving chamber (113) should be non-conductive material. FIG. 3 depicts another system (114) in which the receiving chamber include at least a portion (115) that is electrically conductive and electrical member (116) is directly affixed to said portion. The dispensing chamber can include a portion (117)

that is electrically conductive, wherein electrical member (118) is directly affixed to said portion. The portion of the dispensing chamber that contacts electrolyte in the receiving chamber (119) should be a non-conductive material.

The number of apertures occurring on each dispensing member is not limited, and can include 1 or more apertures, for instance 1-1,000, 1-500, 1-250, 1-100, 1-50, 1-25, 1-10, 1-5, 1-2, 5-100, 5-50, 5-25, or 5-10 apertures. In certain embodiments the dispensing member will have a single aperture.

Figure 4:
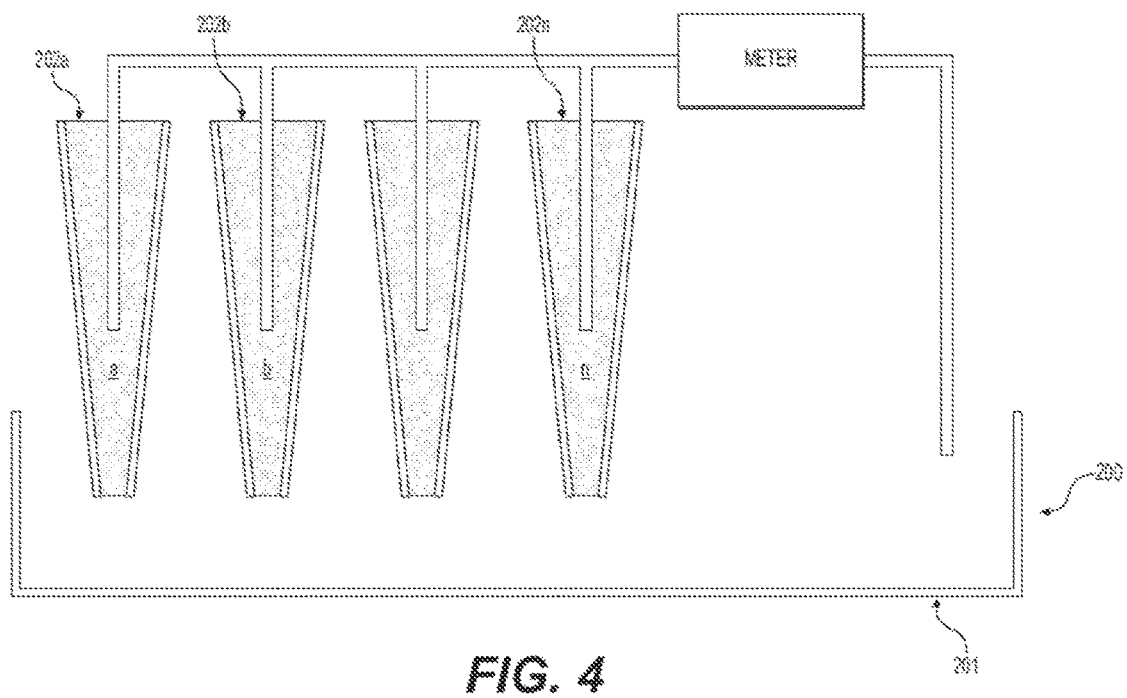
FIG. 4 depicts an embodiment of the invention, in which a plurality of dispensing chambers are disposed in a receiving chamber.

FIG. 4 illustrates another embodiment of the invention. The system (200) includes a receiving chamber (201) and a plurality of dispensing chambers (202a, 202b . . . 202n). The number of dispensing chambers is not limited, and can include 2-1,000, 2-500, 2-250, 2-100, 2-50, 2-25, 2-10, 5-10, 10-100, 25-100, or 50-100 dispensing chambers. Systems having a plurality of dispensing chambers can be configured in the same fashion described with regard to FIG. 1, 2, or 3. For instance, at least a portion of the receiving chamber can be directly affixed to the electrical member, a portion of the dispensing chamber can be directly affixed to the electrical members, or both. Other configurations are also envisioned consistent with the embodiments described herein.

Figure 5:
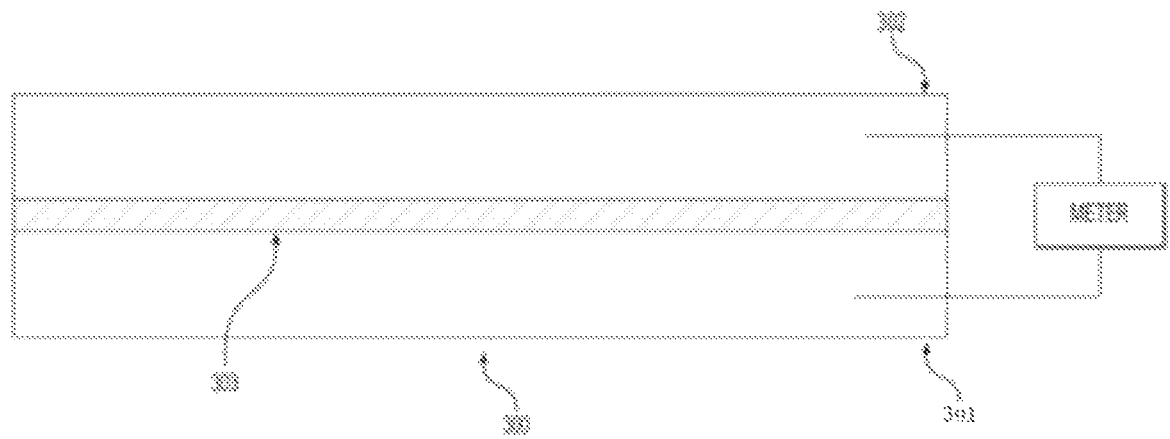
FIG. 5 depicts an embodiment of the invention, in which a dispensing chamber is separated from a receiving chamber by a porous membrane.

FIG. 5 depicts another embodiment of the invention, in which the system (300) includes a receiving chamber (301) and dispensing chamber (302) separated by a porous membrane having a plurality of apertures (303). The membrane can be a non-conductive material, whereas either, or both the receiving and dispensing chambers can include at least a portion of a conductive material directly affixed to an electrical member.

In certain embodiments, the aperture may define an opening having a surface area from 1 $nm^2$ to 20 $\mu m^2$, from 10 $nm^2$ to 10 $\mu m^2$, from 100 $nm^2$ to 10 $\mu m^2$, from 100 $nm^2$ to 10 $\mu m^2$, from 500 $nm^2$ to 10 $\mu m^2$, from 1 $\mu m^2$ to 10 $\mu m^2$, from 1 $\mu m^2$ to 7.5 $\mu m^2$, or from 1 $\mu m^2$ to 5 $\mu m^2$. In the case of circular, or nearly circular apertures, the opening may be define by the diameter of the aperture, for instance from 0.001-100 µm, from 0.01-100 µm, from 0.1-100 µm, from 0.1-50 µm, from 0.1-25 µm, from 0.5-25 µm, from 1-25 µm, from 1-10 µm, from 1-5 µm, from 0.5-10 µm, or from 0.5-10 µm.

Figure 8:
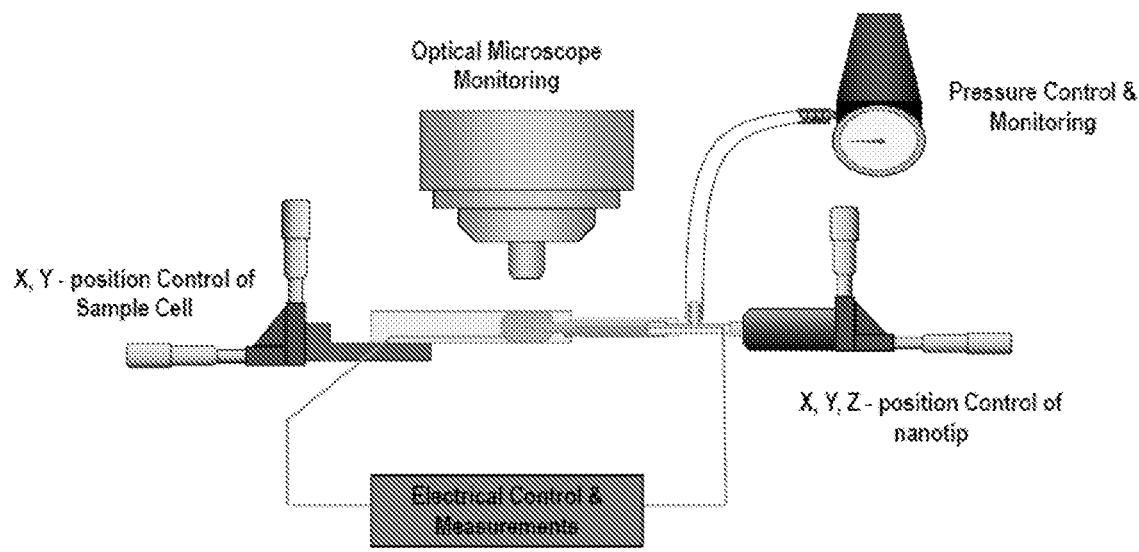
FIG. 8 depict a schematic of a crystallization system having x-y position controls for the receiving chamber, and x-y-z position controls for the dispensing chamber. The system further includes a pressure control and monitoring system, and an optical microscope monitoring system.
Figure 10:
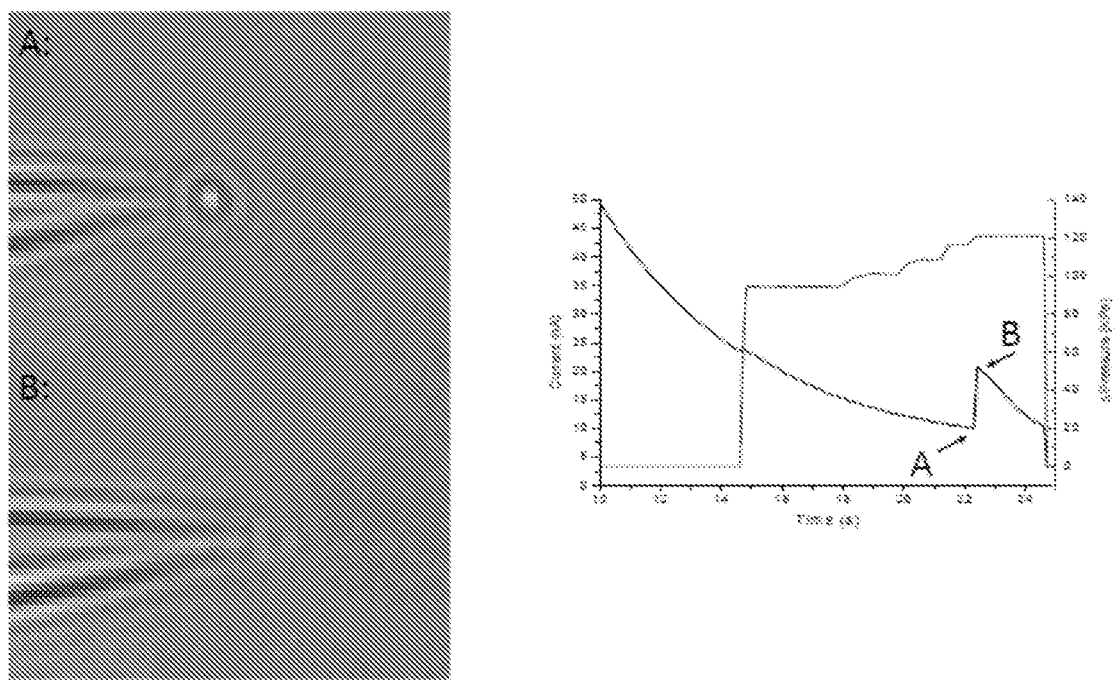
FIG. 10 depicts the use of pressure to removed unwanted precipitate from the dispensing apparatus. The bubble at point A is approximately 1 micron in diameter, which is dislodged from the tip by a momentary pressure increase.

In some embodiments, the system can include controls to permit controlled positioning of the dispensing and receiving chamber. For example, the receiving chamber can be moveable along either an x-axis or y-axis, and the dispensing chamber can be moveable along an x-axis, y-axis, or z-axis. An exemplary schematic is shown in FIG. 8. Also shown in FIG. 8 is a pressure monitoring and control system. By increasing the pressure, unwanted precipitates can be dislodged from the tip of the dispensing chamber (FIG. 10). The left shows brightfield images taken at time point A & B. The whole time trace monitored by current and pressure are in the right panel. Further, by decreasing the pressure, formed crystal can be held on the aperture for further maneuvering or harvesting. The pressure across the two chambers can also further control the flow of one solution into another if needed.

Figure 11:
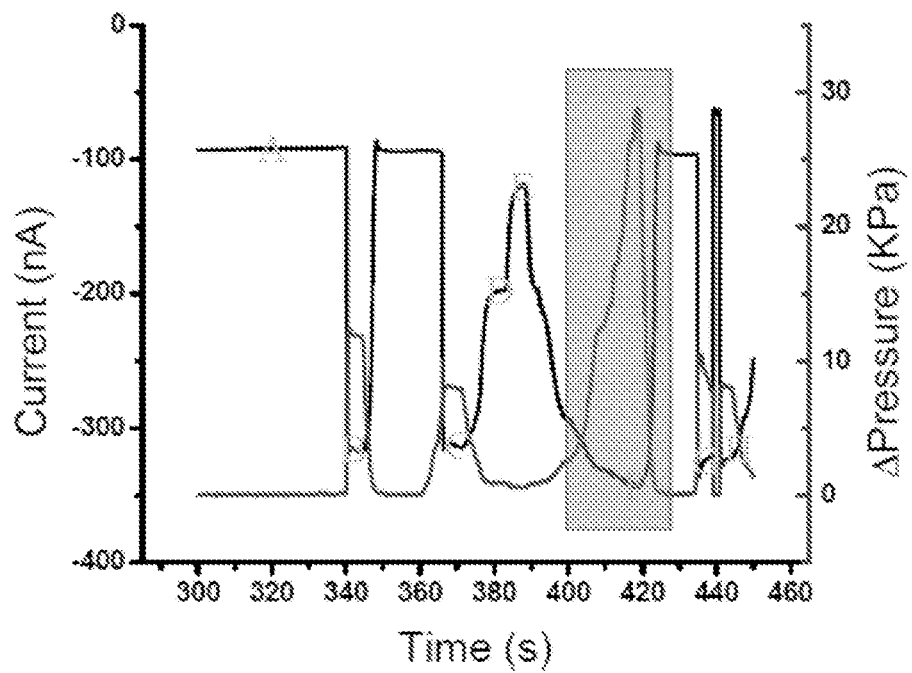
FIGS. 11 and 12 depict the relationship between pressure and current. A 5% increase in pressure over atmosphere results in an approximately 350% increase in current.
Figure 12:
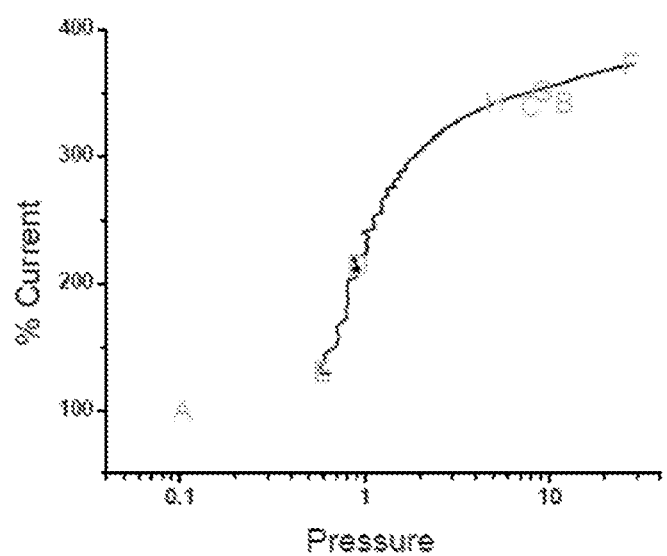

FIG. 11 presents the electrical current changes (at a constant applied potential of −0.3 V) induced by the varied pressure difference across the two solutions. The correlation between the current and pressure is plotted in FIG. 12. The solid line was obtained by processing the data in the time range of about 400-430 s in FIG. 11. Representative points were included, showing the highly sensitive yet inclusive nature of the correlation.

Electrically non-conductive materials which can be used in the system include inorganic materials such as glass and ceramics, polymeric materials such as fluoropolymers. Particularly preferred non-conductive materials include quartz ($SiO_2$) and polytetrafluoroethylene (PTFE or Teflon).

Electrically conductive materials which can be used in the system include conductive glass, e.g., indium tin oxide and other doped inorganic materials (silicon based, metal oxide based), metals, carbon and conductive polymers.

The electrical member may be a wire made one or more of the following electrical conductors, C, Au, Pt, Ag, Cu, W and the like.

Methods of Crystallization

The systems disclosed herein may be used to selectively and controllably crystalize a compound from a solution. The compound can be a small molecule or biomacromolecule. In some instance, the compound can be a complex, for instance a drug-protein complex, protein-nucleic acid complex, or a protein-protein complex.

Typically, either the dispensing or receiving chamber will contain a solution of the target compound (i.e., the compound to be crystallized), while the other chamber will contain a solution of precipitant. Preferred embodiments include those in which the receiving chamber contains the target compound solution and the dispensing chamber includes the precipitant solution. When the two chambers contain different compounds and electrolytes, species in one solution may be controllably introduced into the other under an applied electric field across the two chambers. In some instances a pressure difference across the two solutions may also be employed in order to further control the mixing rate. The two solutions may have different ionic strength and pH. Because the solubility of many compounds, including biomacromolecule, is a function of pH, acidic (or basic) solutions are capable of serving as both the electrolyte and the precipitant. A precipitant solution may include a mineral acid like HCl, and may have a pH between 1-7, 3-6.5, 3.5-6.5, 4.0-6.5, or 4.0-6.0. The pH of the compound solution may be greater than the lowest solubility point (such as an isoelectric point of a protein). In such instances, the pH of the precipitating solution should be lower than the pH of the target solution. [For example, the isoelectric pH (or lowest solubility) of insulin is around 5. By making a saturated insulin solution around pH 8 as the sample solution, and using the precipitating solution pH around 1-5, the introduced acid will lower the pH of the sample solution from 8, which cause supersaturation and thus nucleation]. In other cases, the compound solution may have a pH that is less than the isoelectric point of the protein, and the precipitant solution will contain a base. Other precipitating reagents are known in the art and include compounds like polyethylene glycols. In other embodiments, the precipitant contains an anti-solvent for the target compound, or a precipitating reagent. Anti-solvent refers to any solvent in which the target compound is substantially non-soluble. The anti-solvent and solvent will be miscible with each other.

The compound solution can be an undersaturated, saturated or supersaturated solution of the target compound.

In some embodiments, a potential amplitude from 0.01-10.0 V is applied to the system. In other instances, a potential amplitude from 0.10-5.0 V, from 0.10-2.5 V, from 0.10-1.0 V, from 0.25-1.0 V, from −0.3-1.0V, or −0.1-0.8V (the starting potential and final potential can be of different polarity −/+). The direction of potential gradient, or electric field, can be either positive or negative from one solution to another. In certain embodiments, the crystallization process includes at least a nucleation step and a growth step. The applied voltage (or current) at the nucleation step can be greater than the applied voltage (or current) for the growth step. The nucleation step can include application of a constant DC potential (V-clamping) or a constant DC current (I-clamping). Similarly, the growth step can include the application of a constant DC potential (V-clamping) or a constant DC current (I-clamping). The nucleation step can include application of a constant DC potential from 450-1,500 mV, 600-1,500 mV, 700-1,250 mV, or 700-1000 mV. The nucleation step can include application of a constant DC current from 1 pico Amps −1 mille A, but most likely in nanoAmps range. The growth step can include application of constant potential/current which is lower than the nucleation step potential/current.

Figure 9:
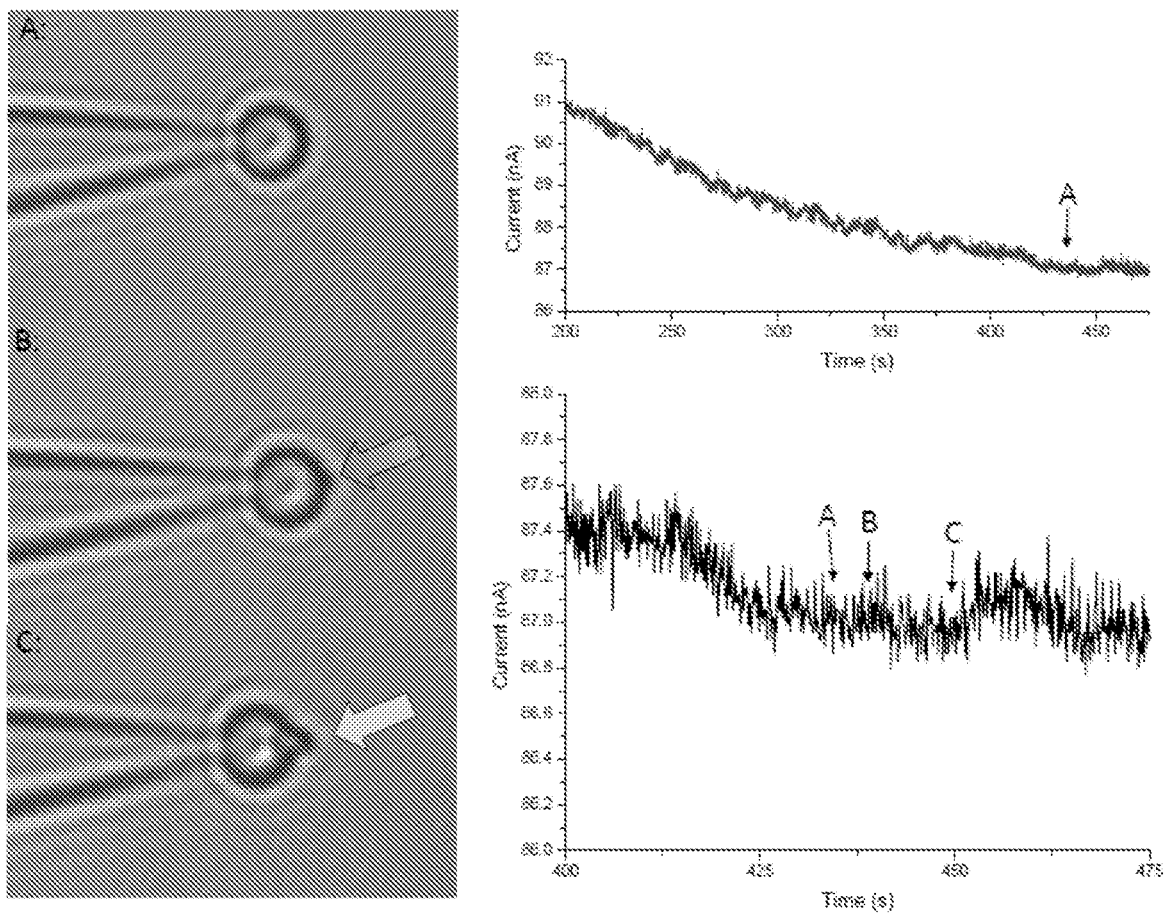
FIG. 9 depicts the use of a pulse to control seed formation. The top panel depicts a 300 mV bias with no pulse, −50 mV 20 second precondition, 1M HCl inside the dispensing chamber, with a silver electrode directly contacting the insulin solution. The bottom panel depicts a pulse at point A, in which a nucleation site is visible at point B, and a seed is observed at point C, approximately 12 seconds after the pulse.

In certain embodiments, a pulse in potential (or current) with programmed amplitude and duration is added to the applied constant or ramping potential (current). A single pulse can be used to generate the crystal embryo (or 'seed'), while in other embodiments 2, 3, 4, 5, 6, 7, 8, 9, 10, 15, 25, 50, 75 or 100 pulses can be used. In certain instances, the method can include one or more pulse waveform sequences. Exemplary pulse sequences include triangular, AC sine and square wave, with square wave being preferred. The images in FIG. 9 show the earliest optical features resolved during nucleation step, prior to the crystal growth (shown in FIG. 7). The bubble shape structure on the tip is about few microns in diameter. A 'seed' emerges on the bubble, as indicated by the arrows in image B and C. This 'seed formation' was observed with the triggering by a pulse, i.e. the variation of the applied potential/current at specific magnitude/duration.

In certain embodiments, the constant potential (or current) is applied with a slight oscillation in amplitude at a certain frequency. The amplitude can be at about ±100 mV, about ±75 mV, about ±50 mV, about ±25 mV, about ±20 mV, about ±15 mV, about ±10 mV, or about ±5 mV, while the frequency can be at about 1 mHz, 10 mHz, 100 mHz, 1 Hz, 1 KHz or about 1 MHz. The oscillation allows the recording of capacitance or other phase sensitive electrical parameters for the detection of different crystallization processes. The oscillation also improves the control of mass transport kinetics across the aperture.

In certain embodiments, the system can further include a pressure monitoring and control system in communication with the dispensing apparatus. The system permits the application of pressure to the solvent in the dispensing chamber, providing an additional means for controlling the flow of solution from one chamber to the next. Additionally, if unwanted precipitate develops at the tip of the dispensing chamber, a short increase in pressure can be used to dislodge the material. Removal of unwanted precipitate is depicted in FIG. 10.

EXAMPLES

The following examples are set forth below to illustrate the methods and results according to the disclosed subject matter. These examples are not intended to be inclusive of all aspects of the subject matter disclosed herein, but rather to illustrate representative methods, compositions, and results. These examples are not intended to exclude equivalents and variations of the present invention, which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of reaction conditions, e.g., component concentrations, temperatures, pressures, and other reaction ranges and conditions that can be used to optimize the product purity and yield obtained from the described process. Only reasonable and routine experimentation will be required to optimize such process conditions.

Example 1

Glass slides were glued on top of an ITO glass slide as sidewalls with a 1 mm slit channel for quartz pipette insertion. The wax was melted via heating and applied on top of the glass slides around the slit channel to contain the protein solution with scalable dimensions. The protein solution is confined within the wax wall between the top cover glass and bottom ITO glass. A quartz nanopipette is inserted directly into protein solution either manually or with micromanipulators. The evaporation is confirmed negligible based on the volume retention during these experiments.

A nanopipette loaded with 1 M HCl as the precipitant was inserted into a 50 uL saturated insulin solution that is preloaded inside the sealed slit channel compartment. An Ag/AgCl electrode was inserted inside the long shaft of the nanopipette from the other end, serving as a working electrode while the ITO glass served as a counter electrode. The crystal formation process was monitored optically under an upright microscope continuously. Designed potential waveforms were applied across the nanopipette to actively tune the materials exchange between the interior acid and exterior protein solutions. The materials exchange is generally associated with charge transport that was monitored by recording electrical current during the whole process. Flow can also be driven using a pressure gradient to control material exchange. Without applying any potential externally, diffusion under the concentration gradients of different species will govern the mixing process, which is passive and cannot be adjusted once the two solutions are in place.

Since the isoelectric point of insulin is around 5, insulin molecules are negatively charged in pH 7.6 exterior solutions. To initiate nucleation process a positive potential was applied. Protons will migrate toward the outside of the nanopipette tip while negatively charged insulin molecules are driven toward the nanopipette tip region under the applied electric field. A pH gradient will be established across the nanopipette tip region, primarily outside of the tip due to the higher mobility of protons compared to larger protein molecules. A solubility gradient, lowest near protein isoelectric point, would be established accordingly. The outside solution near the nanotip will make the transition from saturated/stable to metastable even precipitating zones depending on specific conditions. Accordingly, insulin molecules will aggregate, crystallize or precipitate at this spatially confined domain depending on the transport kinetics.

Figure 6:
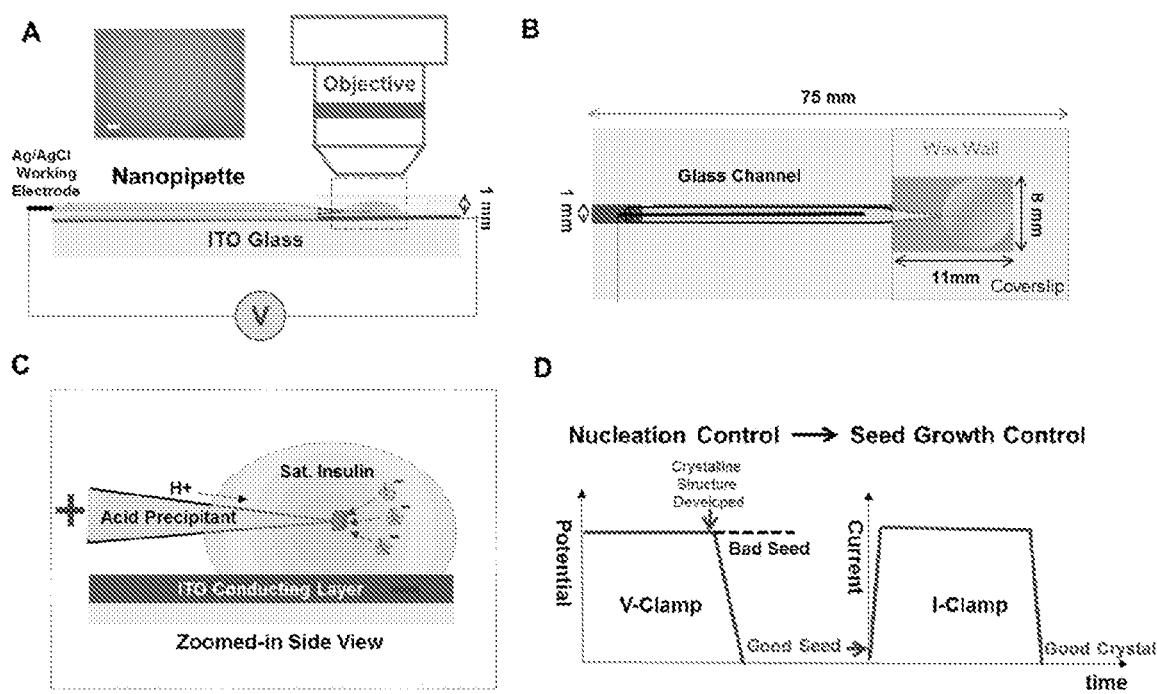
FIG. 6 depicts an embodiment of the invention in which a nanopipette pierces a close/sealed chamber (with an insulating material (such as wax) between glasses) containing a target solution. The wax rests on a conductive surface and forms a hollow chamber inside to contain a droplet of sample solution, which is in electric communication with the precipitant solution in the nanopipette (Panels A and C). Panel C depicts an enlarged depiction of the nanopipette piercing the solution droplet resting on the conductive surface. Panel D depicts an electrical protocol for achieving nucleation and subsequent crystallization.

In order to obtain a good crystal a constant DC potential (bias) was applied, i.e. V-clamping, at the beginning to initiate the molecular assembly and nucleation. Once a characteristic electric current response or optical feature was observed indicating the formation of crystalline structures at the nanopipette tip, the applied potential was decreased immediately to reduce the rate of mass transport, or to avoid poor assembly/growth or amorphous precipitation. Afterward, a programmed current was applied, i.e. i-clamping to control the grown rate and thus the crystal quality. The aforementioned steps and apparatus are depicted in FIG. 6.

Figure 7:
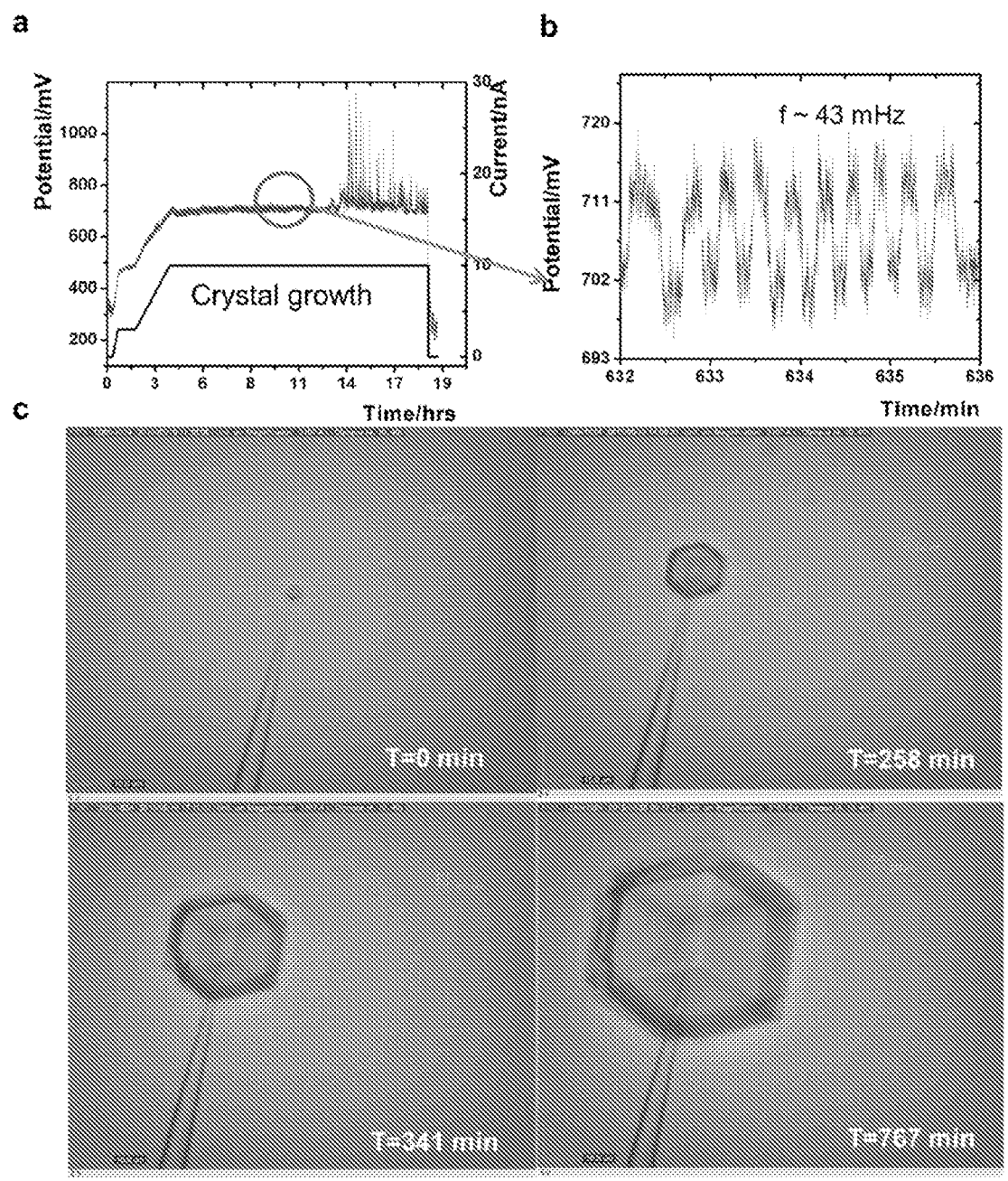
FIG. 7 depicts the in-situ electric potential-current features recorded to crystallize insulin. There are two representative modes of measurements: if the potential is maintained constant by the meter, the current will be the variable being monitored; while if the current is maintained constant, the potential will be the variable being monitored. Panel C depicts the growth over time of the crystal of the tip of a dispensing chamber.

To better control the crystal growth after the nucleation, the current was controlled to increase steadily and held at a constant value (current-clamping) by varying the applied potential. Prior to the current clamping, the applied potential was reduced to zero immediately after an optical or electrical feature was observed during the in-situ monitoring indicating the nucleation step finished. This is essential to avoid defect formation on the embryo. This is the starting point of time zero in the crystal growth step shown FIG. 7. The instrument applied the current as programmed and records the potential over time. Shown in the V-t curve, the potential, albeit remain at hundreds of millivolts to maintain the current, switches between a high and low state at small magnitudes, ca.±10 mV. The oscillation behaviors suggest that the transient adjustments are necessary for the applied potential to ensure steady mass transport. Crystal images collected during the current clamping process are shown in FIG. 7, Panel C. It is worth mentioning that the nanopipette tip is normally embedded in the formed crystal, which is a convenient feature to handle the final crystal by the careful maneuver of the long shaft from the other end of the quartz capillary.

Different sized apertures were explored. For a 5 micron-radius nanopipette, after applying 1 V, no change was observed at the tip region. Over the course of 30 minutes, multiple crystals formed inside the nanopipette tip, and some protein precipitate was observed floating outside the nanopipette tip. When applied potential was stopped, all the crystals disappeared, leaving the protein precipitate.

For the 1 µm nanopipette, after applying 0.1 V, the crystal formed and grew very fast. Thus, a small potential will be enough to trigger the nucleation process, and a single crystal can be controlled. However, it is worth mentioning that such fast growth tends to introduce defects and might be unfavorable for the synthesis of high quality crystals. The preferred dimension of the nanotips would be below 1 micron or in nanometer range.

The compositions and methods of the appended claims are not limited in scope by the specific compositions and methods described herein, which are intended as illustrations of a few aspects of the claims and any compositions and methods that are functionally equivalent are intended to fall within the scope of the claims. Various modifications of the compositions and methods in addition to those shown and described herein are intended to fall within the scope of the appended claims. Further, while only certain representative compositions and method steps disclosed herein are specifically described, other combinations of the compositions and method steps also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated. The term "comprising" and variations thereof as used herein is used synonymously with the term "including" and variations thereof and are open, non-limiting terms. Although the terms "comprising" and "including" have been used herein to describe various embodiments, the terms "consisting essentially of" and "consisting of" can be used in place of "comprising" and "including" to provide for more specific embodiments of the invention and are also disclosed. Other than in the examples, or where otherwise noted, all numbers expressing quantities of ingredients, reaction conditions, and so forth used in the specification and claims are to be understood at the very least, and not as an attempt to limit the application of the doctrine of equivalents to the scope of the claims, to be construed in light of the number of significant digits and ordinary rounding approaches.

What is claimed is:

1. A crystallization system, comprising:
   at least one receiving member comprising a first electrically conductive member;
   at least one dispensing member comprising a second electrically conductive member, wherein the second electrical member is affixed to the receiving member;
   wherein the first and second electrical members are coupled in electrical communication;
   wherein the dispensing member comprises:
      an electrically insulating material proximal to the receiving member, a portion of the electrically insulating material defining at least one aperture, said portion in fluid communication with a receiving chamber; and
   whereby a complete electric circuit is obtained when electrolytes are present in the receiving and dispensing members.

2. The system according to claim 1, wherein the portion defining at least one aperture has a dimension or surface area from 1 nm$^2$ to 20 µm$^2$.

3. The system according to claim 1, comprising a single dispensing member.

4. The system according to claim 1, comprising a plurality of dispensing members.

5. The system according to claim 1, wherein the dispensing body comprises an elongated body terminating at one end with the portion of the electrically insulating material defining at least one aperture.

6. The system according to claim 1, wherein the portion defines a plurality of micro-openings.

7. The system according to claim 1, further comprising a pressure control system in communication with the dispensing chamber.

8. A system for crystallization, comprising:
   at least one receiving member comprising a first electrically conductive member;
   at least one dispensing member comprising a second electrically conductive member;
   wherein the first and second electrical members are coupled in electrical communication;
   wherein the dispensing chamber and receiving chamber are separated by a porous membrane;
   whereby a complete electric circuit is obtained when electrolytes are present in the receiving and dispensing members.

9. A method for crystallizing a compound, the method comprising:
   providing a solution of a compound in at least one receiving member comprising a first electrically conductive member;
   providing a solution of a precipitate in at least one dispensing member comprising a second electrically conductive member;
   wherein the receiving and dispensing electrical members are coupled in electrical communication; and
      applying an electric field sufficient to controllably introduce the solution of precipitant into the solution of compound, wherein the applying an electric field comprises
   applying a first electric field sufficient to induce a nucleation of the compound at the one or more openings of the second receptacle, and applying a second electric field following nucleation, wherein the second electric field controls growth of the crystal.

10. The method of claim 9, wherein the second electric field is different from the first electric field.

11. The method of claim 9, wherein the first electric field is voltage-clamped (constant DC potential) or voltage-ramped; or the first electric field is current-clamped (constant current) or current-ramped; or the first electric field is a multi-segment combined DC-AC potential including a constant, pulsed and/or ramped waveform.

12. The method of claim 9, wherein the second electric field is current-clamped or current ramped; or the second electric field is voltage-clamped or voltage ramped; or the second electric field is a multi-segment combined DC-AC potential including a constant and ramped waveform.

13. The method of claim 9, wherein the first electric field is applied with oscillations at controlled/programmed amplitude and frequency.

14. The method of claim 9, wherein the second electric field is applied with oscillations at controlled/programmed amplitude and frequency.

15. The method according to claim 11, wherein the first electric field is a pulsed waveform comprising a triangular waveform, an AC sine, or a square wave.

16. The method of claim 9, wherein the compound comprises a small molecule drug.

17. The method of claim 9, wherein the compound comprises a peptide.

18. The method of claim 9, wherein the compound comprises a protein.

19. The method of claim 9, wherein the compound comprises a nucleic acid.

20. The method of claim 9, wherein the compound comprises a complex.

21. The method of claim 9, wherein the compound solution is a saturated solution, near saturated solution or super-saturated solution.

22. The method of claim 9, wherein the precipitant comprises an anti-solvent.

23. The method of claim 9, wherein the precipitant comprises an acid.

24. The method of claim 9, wherein the precipitant comprises a base.

25. The method of claim 9, wherein the precipitant comprises a precipitating reagent.

* * * * *